(12) United States Patent
Lebedev et al.

(10) Patent No.: US 7,129,782 B2
(45) Date of Patent: Oct. 31, 2006

(54) FULLY DIFFERENTIAL AMPLIFIER WITH START UP CIRCUIT

(75) Inventors: Semyon Lebedev, Haifa (IL); Eshel Gordon, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/813,941

(22) Filed: Mar. 30, 2004

(65) Prior Publication Data

US 2005/0218985 A1 Oct. 6, 2005

(51) Int. Cl.
*H03F 3/45* (2006.01)
(52) U.S. Cl. .................................... 330/258; 330/253
(58) Field of Classification Search ............... 330/258, 330/253, 259, 260
See application file for complete search history.

(56) References Cited

U.S. PATENT DOCUMENTS 5,838,199 A * 11/1998 Nakamura ................. 330/258
6,265,941 B1 * 7/2001 Lopata ...................... 330/258
6,445,216 B1   9/2002 Bruneau et al.
6,833,759 B1 * 12/2004 Sobel ........................ 330/282

OTHER PUBLICATIONS

Gonggui Xu and Sherif H.K. Embabi, "A Systematic Approach in Constructing Fully Differential Amplifiers", IEEE Transactions on Circuits and Systems-II: Analog and Digital Signal Processing, vol. 47, No. 11, Nov. 2000, pp. 1343-1347.
J.F. Duque-Carrillo, "Continuous-time common-mode feedback networks for fully-differential amplifiers: a compartive study", 1993 IEEE, pp. 1267-1270.

* cited by examiner

*Primary Examiner*—Henry Choe
(74) *Attorney, Agent, or Firm*—Blakely, Sokoloff, Taylor & Zafman LLP

(57) ABSTRACT

A fully differential amplifier having a start-up circuit is described. The fully differential amplifier may be a two-stage amplifier with a start-up circuit coupled between the stages. The start-up circuit may include a sense circuit coupled between a common mode input and internal nodes that are connect to output transistors of the fully differential amplifier. The sense circuit produces a reset signal that forces the fully differential amplifier into a mode of operation.

17 Claims, 8 Drawing Sheets

FULLY DIFFERENTIAL AMPLIFIER WITH START UP CIRCUIT

FIELD

Embodiments of this invention relate to the field of circuits and, in particular, to amplifier circuits.

BACKGROUND

In the design of complementary metal-oxide semiconductor (CMOS) integrated circuits, differential amplifiers are used for various applications because a number of advantages can be derived from these types of amplifiers, as compared to single-ended amplifiers. Differential amplifiers are used to amplify analog, as well as digital signals, and can be used in various implementations to provide an output from the amplifier in response to differential inputs. For example, a general-purpose differential amplifier amplifies the difference of the two input signals. But these differential amplifiers can be readily adapted to function as an operational amplifier, a comparator, a sense amplifier and as a front-end buffer stage for another circuit, etc. Differential amplifiers are utilized where linear amplification having a minimum of distortion is desired. A fully differential amplifier differs from a differential amplifier in that its outputs are also differential. Using a fully differential design gives a designer a way to dramatically reduce the common mode noise present in the system and the second harmonic in the fast fourier transform of the output signal.

FIG. 1A illustrates a conventional fully differential amplifier. The fully differential amplifier shown in FIG. 1A is a two-stage amplifier with a common mode feedback CMFB controlling the first stage, load transistors M3 and M4. A common mode feedback input CMIN signal is supplied by the resistor/capacitor chain: R1, R2, C1, and C2. In some applications such as switch capacitor networks, there can be a state where the amplifier inputs are connected with its outputs, as illustrated in FIG. 1B. If for some reason there is positive supply (VCC) voltage on both outputs VOUTP & VOUTN, a common mode feedback amplifier AMPCM will be saturated, both load and input transistors M1–M2 of the main amplifier are in a cut off state, and the nodes n1, n2 are in an undefined condition. Under this condition, any small leakage to ground on these nodes will cause the state to be stable and the amplifier may never get out of this state. As such, the amplifier will be in a stable, but undesired state of operation.

BRIEF DESCRIPTION OF THE DRAWINGS

Embodiments of the present invention are illustrated by way of example and not intended to be limited by the figures of the accompanying drawings.

DETAILED DESCRIPTION

In the following description, numerous specific details are set forth such as examples of specific systems, circuits, components, etc. in order to provide a thorough understanding of embodiments of the present invention. It will be apparent, however, to one skilled in the art that these specific details need not be employed to practice embodiments of the present invention. In other instances, well known components or methods have not been described in detail in order to avoid unnecessarily obscuring embodiments of the present invention.

A fully differential amplifier having a start-up circuit is described. In one embodiment, the fully differential amplifier may be a two-stage amplifier with a start-up circuit coupled between the stages. In one embodiment, the start-up circuit may include a sense circuit coupled between a common mode input and internal nodes that are connect to output transistors of the fully differential amplifier.

The apparatus and methods discussed herein provide a solution to an issue where the fully differential amplifier might turn on at an undesired stable working point, at which the amplifier will not function at all. In such a case, the apparatus and methods described herein may automatically produce a reset signal at the output of the sense circuit that will lower the outputs of the fully differential amplifier and place it in a normal operation mode.

Figure 1A:
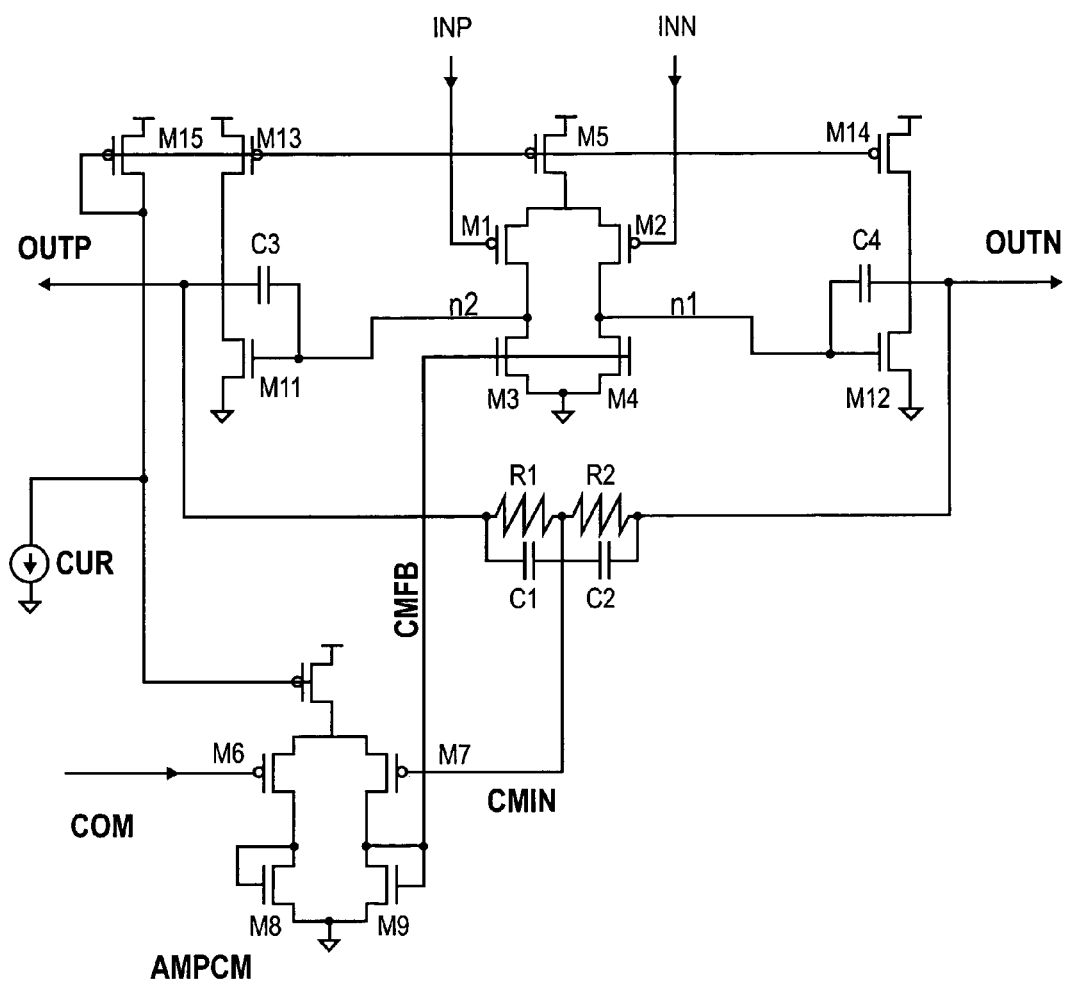
FIG. 1A illustrates a conventional fully differential amplifier.
Figure 1B:
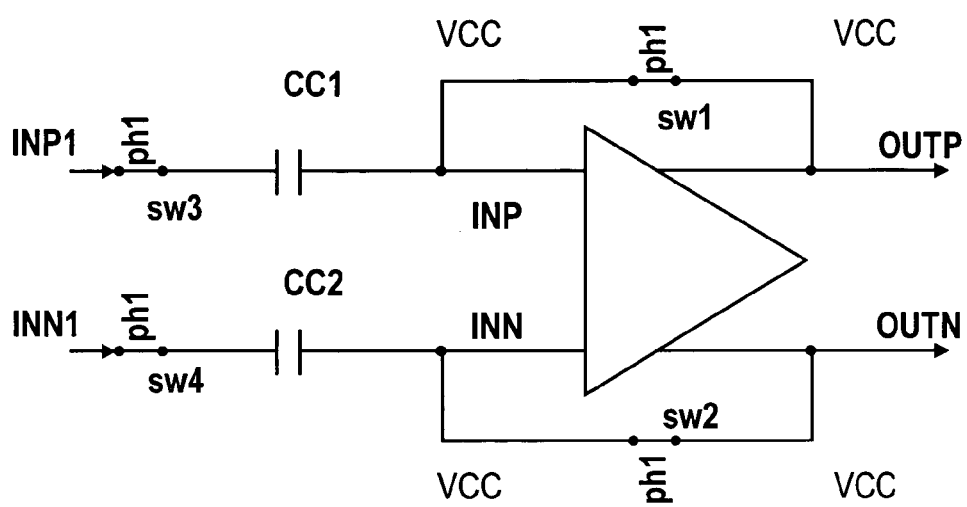
FIG. 1B illustrates a conventional fully differential amplifier having its inputs connected to its outputs.
Figure 2:
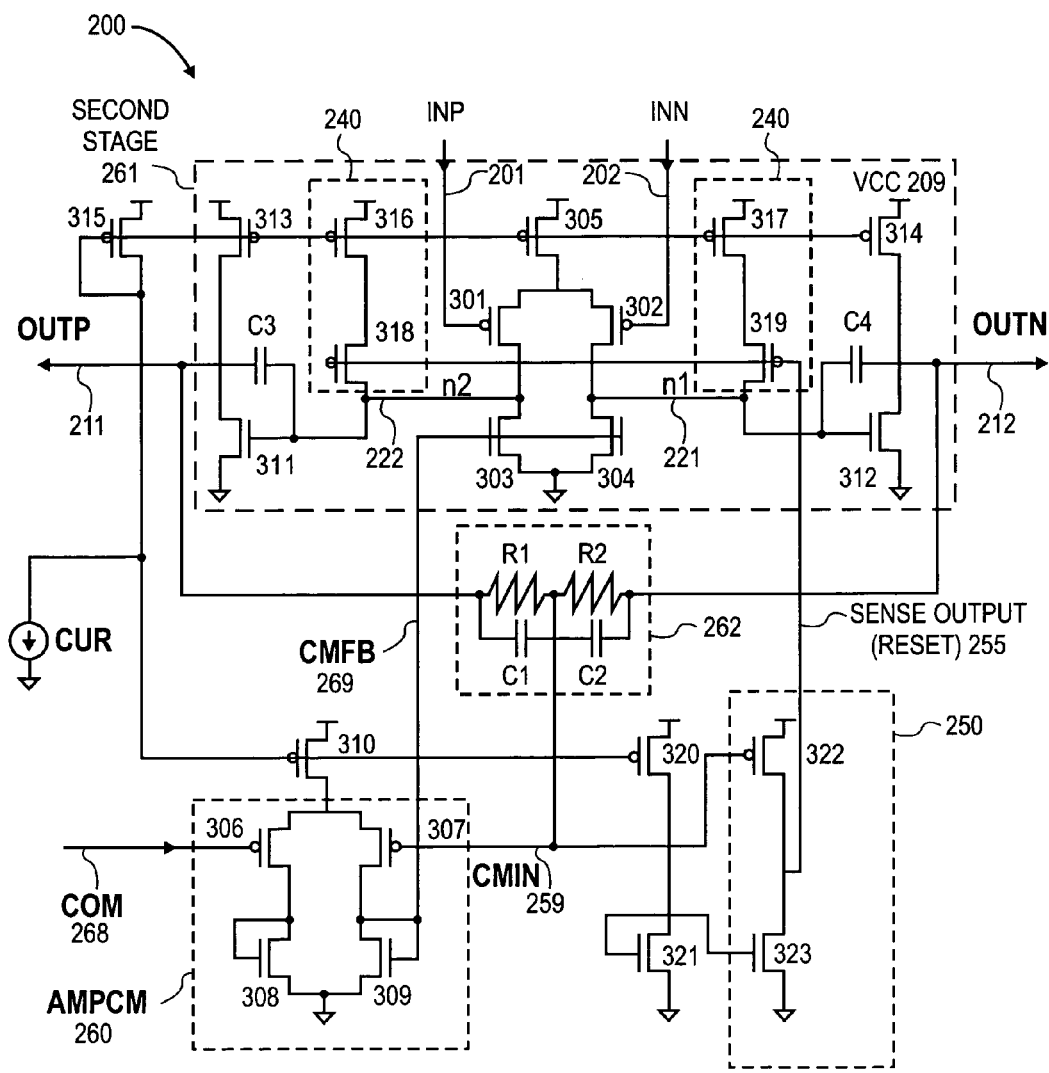
FIG. 2 illustrates one embodiment of a fully differential amplifier having a start-up circuit.

FIG. 2 illustrates one embodiment of a fully differential amplifier having a start-up circuit. In this embodiment, amplifier 200 includes a start-up circuit coupled to core amplifier circuitry. The start-up circuit may include sense circuit 250 and pull up circuit 240. In one embodiment, the core amplifier circuitry may be a two-stage amplifier with the first stage composed of a common mode feedback (CMFB) amplifier 260 and a second stage 261 having input transistors 301, 302 and output gain transistors 311, 312. Transistors 315, 313, 316, 305, 317, 314, 310, 320 and 321 form the bias, loads (current mirrors) for the first and second stages and the start-up circuit. The bias and current mirror (load) transistors may be considered as devices within or external to the first and second stages and the start-up circuit. In alternative embodiments, amplifier 200 may have more than two stages.

In one embodiment, the first stage CMFB amplifier 260 includes input transistors 306 and 307 coupled to load transistors 308 and 309, respectively. Input transistor 306 has a gate coupled to receive a common (COM) signal. The drain and gate of load transistor 309 of first stage CMFB are coupled to controls of the first stage 261 load transistors 303 and 304 via CMFB 269.

Figure 7:
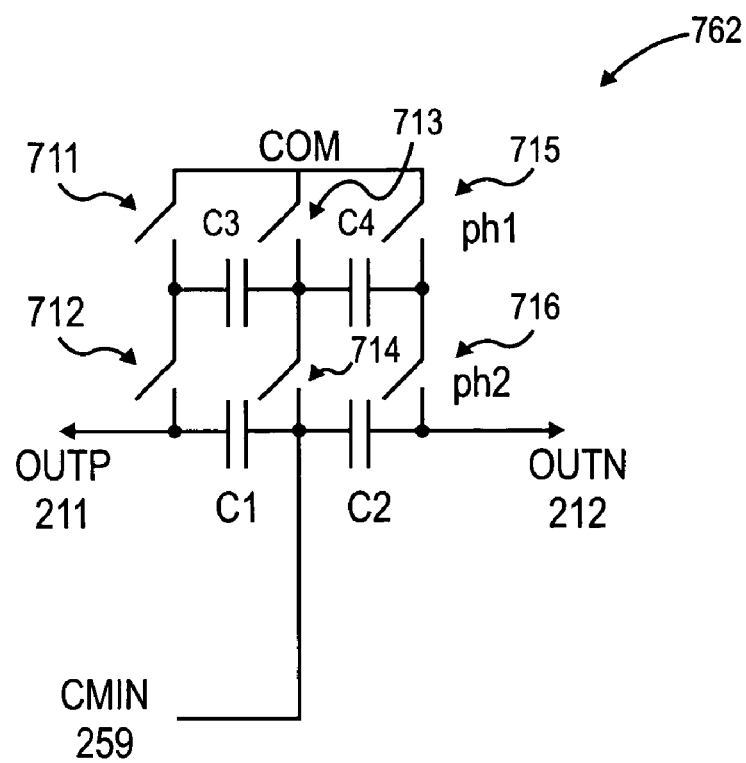
FIG. 7 illustrates an alternative embodiment of a common mode feedback network.

In one embodiment, a common mode feedback input CMIN 259 signal may be generated using a common mode resistor/capacitor (RC) feedback network 262. The CMIN 259 signal of common mode RC feedback network 262 closes the common mode feedback loop amplifier's main outputs OUTP 211 and OUTN 212 via the AMPCM amplifier input of transistor 307 and load transistors 303 and 304. The resistors R1 and R2 provide the function (OUTP−OUTN)/2, thus extracting a common mode signal. The capacitors C1 and C2 do the same function (OUTP−OUTN)/2 for high frequencies. In another embodiment, CMIN 259 signal may be generated by a switching capacitor network 762 as illustrated in FIG. 7. Switching capacitor network 762 includes capacitors C1, C2, C3 and C4 and switches 711–716. The operation of a switching capacitor network is known in the art; accordingly, a detailed discussion is not provided. Alternatively, the CMIN 259 signal may be generated using other circuit configurations known in the art.

A sense circuit 250 is coupled between the first stage AMPCM 260 and the second stage 261. In one embodiment, the sense circuit 250 may be an amplifier having transistors 322 and 323. Transistor 323 is part of a current mirror that establishes a predefined small current through transistor 322. The gate of transistor 322 is coupled to the common mode feedback input CMIN 259 signal. In one embodiment, CMIN 259 signal may be configured to be approximately less than half VCC 209 (e.g., in one embodiment about 1V) that turns on transistor 322 and, thereby, shorts the sense circuit output 255 to VCC. Sense circuit output 255 is coupled to the gates of transistors 318 and 319. The shorting of sense circuit output 255 to VCC 209 generates a reset signal that closes transistors 318 and 319 such that no currents are inserted into node (n1) 221 and node (n2) 222. When the potential on both outputs OUTP 211 and OUTN 212 goes to VCC 209 and turns off transistor 322, the sense circuit output 255 goes low and the current from VCC 209 begins to charge nodes 221 and 222. The charge on nodes 221 and 222 is large enough to cause the voltage on these nodes to rise and turn on transistors 311 and 312, which in turn, lowers the outputs OUTP 211 and OUTN 212, thereby causing the main CMFB 269 to operate and close the sense circuit 250 and transistors 318 and 319.

Figure 3:
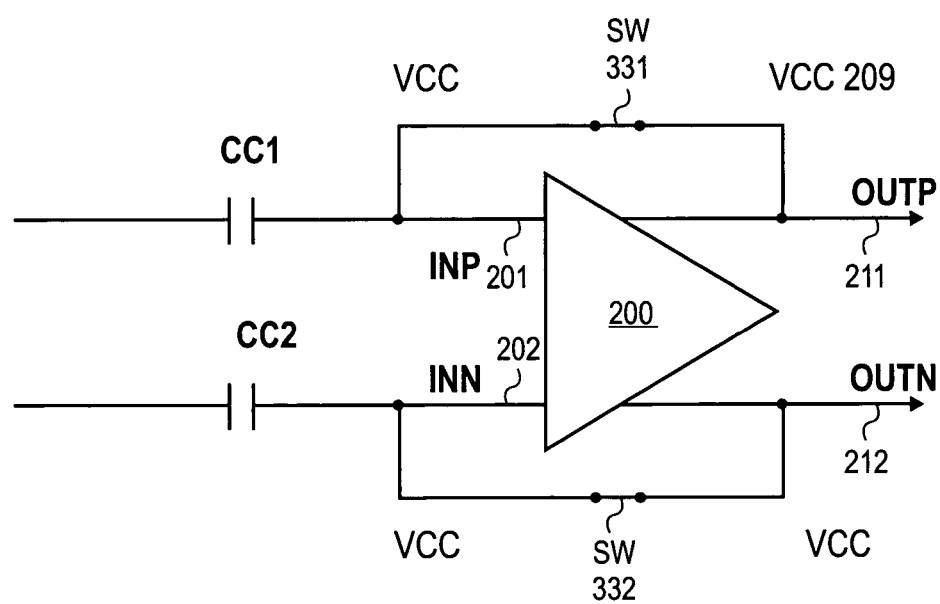
FIG. 3 illustrates one embodiment of the fully differential amplifier of FIG. 2 having its inputs connected to its outputs.

FIG. 3 illustrates one embodiment of the fully differential amplifier of FIG. 2 having its inputs connected to its outputs. In some applications where amplifier 200 may be used (e.g., a switch capacitor network), there can be a state where the amplifier 200 has its inputs 201 and 202 connected with its outputs 211 and 212, respectively, via switch (SW) 331 and switch 332. If there is positive supply voltage VCC 209 on both outputs OUTP 211 and OUTN 212, the common mode feedback amplifier (AMPCM) 260 of FIG. 2 will be saturated (turned off). When the common mode feedback amplifier 260 is saturated, the input transistors 301 and 302 and the load transistors 303 and 304 are in a cut off state, and the nodes 221 and 222 may otherwise be in an undefined condition without sense circuit 250. Sense circuit 250 may operate to avoid a possible state where the amplifier's state is stable but in an undesired state of operation.

Sense circuit 250 may enable a normal mode of operation for amplifier 200 under various starting condition and, thereby, eliminate the possibility of amplifier 200 getting into a non-operating state under various sequences of turn-on or turn-off of voltage supplies VCC 209 and signals input and output on INP 201, INN 202 and OUTP 211, OUTN 212, respectively. A non-operating state can happen when the input transistors 301 and 302 are turned off (e.g., the input voltage is near VCC). When this happens, the potential at nodes 221 and 222 is undefined and can be very low near ground. Transistors 311 and 312 are also turned off and the outputs OUTP 211 and OUTN 212, respectively, go high to VCC 209. One cause of such a state may be the connection shown in FIG. 3.

Referring again to the embodiment of FIG. 2, transistors 319, 318 and sense circuit 250 form the start-up circuit. Transistor 319 is coupled (via bias transistor 317) between VCC 209 and node 221 and transistor 318 is coupled (via current source transistor 316) between VCC 209 and node 222, respectively, and form a pull-up circuit 240. The pull-up circuit 240 operates to bring nodes 221 and 222 to a high potential value high enough to turn on transistors 311 and 312. As previously discussed, the turning on of transistors 311 and 312 lowers the outputs OUTP 211 and OUTN 212 and returns amplifier 200 to its normal operation mode. The normal operation mode of amplifier 200 is when the amplifier is functional to amplify an input differential signal at INP 201, INN 202. In the normal operation mode, the input transistors 301 and 302 are not turned off (have current flowing through them) and the common mode of the outputs is maintain near the COM 268 signal value (with common mode loop error). In one exemplary embodiment, the COM 268 signal value may be approximately in a range of 1 volt to VCC/2 volts. Alternatively, COM 268 signal values outside the provided exemplary range may be used. The start-up circuit of fully differential amplifier 200 may have other configurations, for example, as discussed below in relation to FIG. 4.

Figure 4:
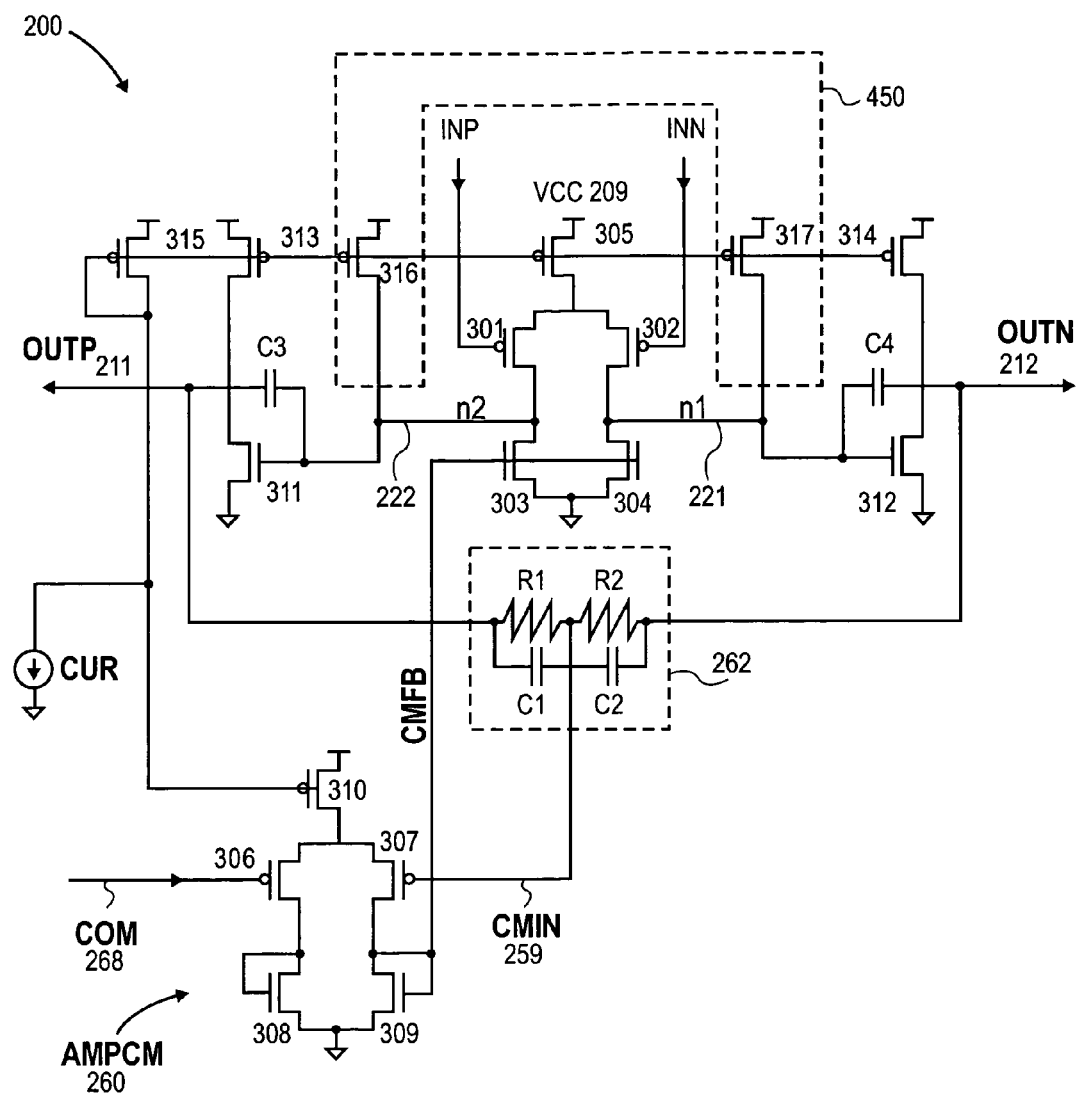
FIG. 4 illustrates another embodiment of a fully differential amplifier having an alternative start-up circuit.

FIG. 4 illustrates another embodiment of a fully differential amplifier 200 having an alternative start-up circuit 450. In this embodiment, start-up circuit 450 includes current source transistors 316 and 317. When the amplifier 200 is in a non-operational mode, the constant currents from transistors 316 and 317 charge nodes 222 and 221, respectively, and turn on transistors 311 and 312, respectively. These constant currents that exist even in the normal operational mode insert an additional error on the common mode value in this embodiment that, if great enough, add to the current consumption of the circuit. One way to address this error is to turn off these currents in the normal operation mode by means of a sense circuit and switches, for example, as illustrated in the embodiment of FIG. 2.

Figure 5:
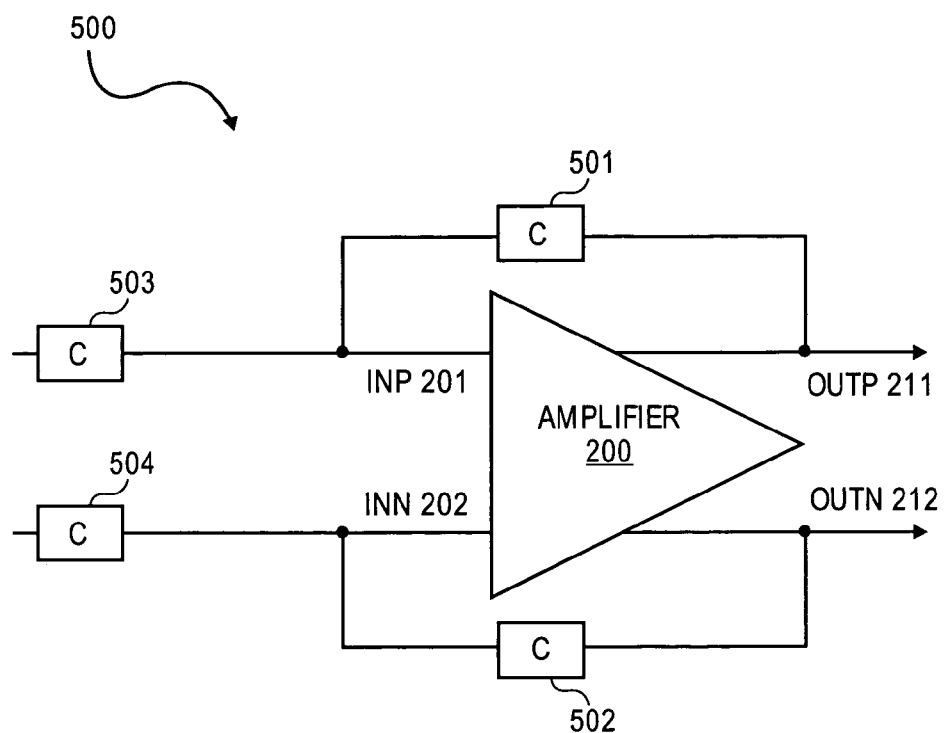
FIG. 5 illustrates one embodiment of external component connections to the fully differential amplifier.

FIG. 5 illustrates one embodiment of external component connections to fully differential amplifier 200. Fully differential amplifier 200 may be used to amplify analog, as well as digital signals, and can be used in various implementations to provide an output from the amplifier in response to differential inputs. The fully differential amplifier 200 amplifies the difference of the two input signals that can be readily configured to operate as a variety of circuits, for example, an analog to digital converter (ADC), an automatic gain control (AGC) amplifier, a filter, a multiplexer, etc. Fully differential amplifier 200 may have one or more external components (C) 501–504 coupled to the inputs 201, 202 and/or outputs 211, 212 in order to configure fully differential amplifier 200 to operate as a particular amplifier circuit 500 (e.g., ADC, AGC, filter, multiplexer, etc). Each of the external components 501–504 may include one or more passive devices (e.g., resistor, capacitor) or active devices (e.g., transistor) or no devices (e.g., a shorted connection). The configuration of a differential amplifier into amplifier circuit 500 is known in the art; accordingly a detailed discussion is not provided.

Figure 6:
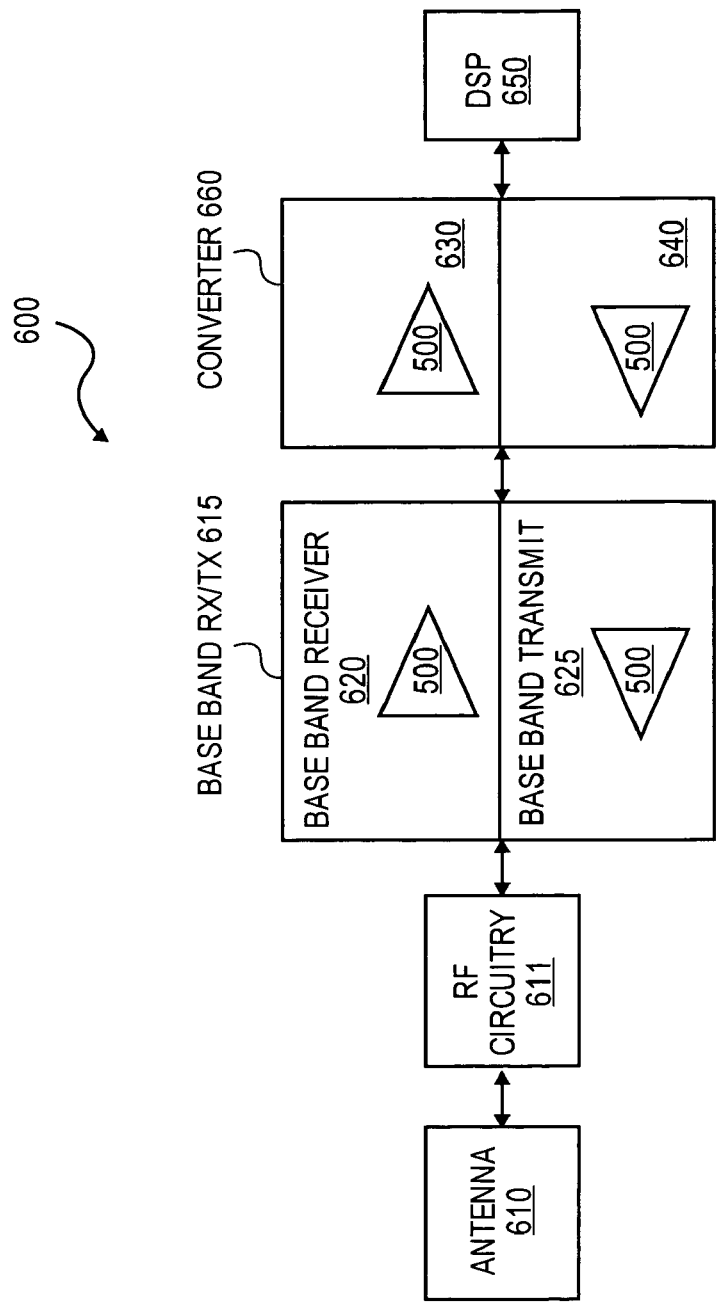
FIG. 6 illustrates a system including an embodiment of the fully differential amplifier.

FIG. 6 illustrates a system including an embodiment of a fully differential amplifier. In this embodiment, fully differential amplifier 200 may be used in one or more circuit blocks of a wireless network interface card (NIC) 600. In this embodiment, wireless NIC 600 may include an antenna 610, RF circuitry 611 (e.g., composed of low noise amplifiers, RF AGCs, up/down frequency converters, frequency synthesizer, etc.), a base band receiver (Rx)/transmitter (Tx) 615 to wirelessly receive and transmit receive analog (e.g., radio frequency) signals, a converter 660 to covert between analog and digital signals, and a digital signal processor 650 to process the digital signals. Converter 660 may include an ADC 630 to convert received analog signals to digital signals and a DAC to convert digital signals to analog signal for transmission by Tx 615 to antenna 610. In another embodiment, another type of processor may be used instead of DSP 650, for example, a general purpose processor. In an alternative embodiment, the blocks shown in FIG. 6 may reside on one or more other carrier substrates (e.g., motherboard, daughter card, etc.).

One or more of the blocks of wireless NIC 600 (e.g., base band filter 620, ADC 630, DAC 640) may include one or more of fully differential amplifier 500 of FIG. 5. For example, in one embodiment, the base band receiver 620 may include one or more of fully differential amplifier 500 configured as an AGC and a filter for gain control and noise filtering of analog signals received from antenna 610. In one embodiment, base band transmitter 625 may include a fully differential amplifier 500 configured as a filter for noise filtering of analog signals output from DAC 640. In one embodiment, antenna 610 may be a dipole antenna for short to medium wave radio frequency broadcasting. Alternatively, other types of antenna may be used.

It should be noted that one or more of the transistors of the fully differential amplifier 200 discussed herein may be viewed as current sources and sinks, so that other devices or circuits having these functions may be employed. Embodiments of the present have been illustrated with Complementary Metal Oxide Semiconductor (CMOS) technology for ease of discussion. In alternative embodiments, other device types and process technologies may be used, for example, Bipolar, NMOS, PMOS, and BiCMOS. VCC is used to represent a voltage supply utilized by the circuit illustrated herein. It should be noted that the circuits described herein may be designed utilizing various voltage supplies.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claim is:

1. A method, comprising:
    sensing outputs of a fully differential amplifier being at a high supply voltage when a common mode feedback amplifier within the fully differential amplifier saturates; and
    returning the fully differential amplifier to a normal mode of operation based on the sensing.

2. The method of claim 1, wherein sensing comprises receiving a common mode feedback signal at an input of a sense circuit being at the high supply voltage and wherein the method further comprises receiving a supply voltage signal on inputs and the outputs of the fully differential amplifier.

3. The method of claim 2, wherein returning comprises lowering the outputs of the fully differential amplifier.

4. The method of claim 3, wherein returning further comprises pushing up voltages of internal nodes of the fully differential amplifier, the internal nodes coupled to gates of the output transistors of the fully differential amplifier.

5. The method of claim 4, wherein returning further comprises turning on the output transistors of the fully differential amplifier to lower the outputs of the fully differential amplifier.

6. The method of claim 1, wherein the fully differential amplifier further comprises input transistors, and wherein the sensing of the saturation is performed when the input transistors are in a cut-off state.

7. A fully differential amplifier, comprising:
    a first stage comprising a common mode feedback amplifier;
    a second stage comprising a plurality of input transistors; and
    a start-up circuit coupled between the first and second stages, wherein the start-up circuit comprises:
        a sense circuit coupled to the common mode feedback amplifier; and
        a pull-up circuit coupled to the plurality of input transistors.

8. The fully differential amplifier of claim 7, further comprising a common mode feedback network coupled to the sense circuit, the common mode feedback amplifier and the plurality of input transistors.

9. The fully differential amplifier of claim 7, wherein the sense circuit comprises:
    a first transistor having a gate coupled to receive a common mode input signal from the common mode feedback network, the first transistor having a drain coupled to the pull-up circuit; and
    a second transistor having a drain coupled to the drain of the first transistor.

10. The fully differential amplifier of claim 9, wherein the common mode feedback network comprises:
    a first resistor coupled in parallel with a first capacitor to form a first resistor-capacitor network, the first resistor-capacitor network coupled between a first one of the outputs of the fully differential amplifier; and the gate of the first transistor of the sense circuit; and
    a second resistor coupled in parallel with a second capacitor to form a second resistor-capacitor network, the second resistor-capacitor network coupled to the first resistor-capacitor network, the second resistor-capacitor network coupled between a second one of the outputs of the fully differential amplifier; and the gate of the first transistor of the sense circuit.

11. The fully differential amplifier of claim 7, further comprising an output stage having a plurality of output transistors coupled to receive a supply voltage, wherein the plurality of input transistors is coupled to receive the supply voltage.

12. The fully differential amplifier of claim 9, further comprising an output stage having a plurality of output transistors coupled to receive a supply voltage, wherein the plurality of input transistors is coupled to receive the supply voltage.

13. The fully differential amplifier of claim 7, wherein the fully differential amplifier is implemented with CMOS technology.

14. The fully differential amplifier of claim 9, wherein the common mode feedback network comprises a switching capacitor network.

15. A fully differential amplifier, comprising:
    means for sensing outputs of the fully differential amplifier being at a high supply voltage when a common mode feedback amplifier within the fully differential amplifier saturates; and
    means for returning the fully differential amplifier to a normal mode of operation based on the sensing of the outputs.

16. The fully differential amplifier of claim 15, wherein the means for sensing comprises means for receiving a common mode feedback signal at an input of a sense circuit, and wherein the fully differential amplifier further comprises a plurality of input transistors coupled to receive a supply voltage and an output stage having a plurality of output transistors coupled to receive the supply voltage.

17. The fully differential amplifier of claim 16, further comprising means for generating the common mode feedback signal.

* * * * *